(12) United States Patent
Hsu et al.

(10) Patent No.: US 11,825,595 B2
(45) Date of Patent: Nov. 21, 2023

(54) MANUFACTURING METHOD OF CIRCUIT BOARD ASSEMBLY

(71) Applicants: Avary Holding (Shenzhen) Co., Ltd., Shenzhen (CN); HongQiSheng Precision Electronics (QinHuangdao) Co., Ltd., Hebei (CN); Garuda Technology Co., Ltd., New Taipei (TW)

(72) Inventors: Mao-Feng Hsu, Taoyuan (TW); Zhi-Hong Yang, Guangzhou (CN)

(73) Assignees: HONGQISHENG PRECISION ELECTRONICS (QINHUANGDAO) CO., LTD., Hebei Province (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/565,538

(22) Filed: Dec. 30, 2021

(65) Prior Publication Data

US 2023/0171875 A1 Jun. 1, 2023

(30) Foreign Application Priority Data

Nov. 30, 2021 (CN) .......................... 202111438219.6

(51) Int. Cl.
*H05K 3/30* (2006.01)
*H05K 3/10* (2006.01)
(Continued)

(52) U.S. Cl.
CPC ......... *H05K 1/0216* (2013.01); *H05K 1/0298* (2013.01); *H05K 1/183* (2013.01); *H05K 3/107* (2013.01); *H05K 3/30* (2013.01)

(58) Field of Classification Search
CPC ...... H05K 1/0298; H05K 1/183; H05K 3/107; H05K 3/30
See application file for complete search history.

(56) References Cited

U.S. PATENT DOCUMENTS 7,947,908 B2 * 5/2011 Mizuno ................. H01L 23/552
361/776
9,137,899 B2 * 9/2015 Ho ....................... H01L 21/6835
(Continued)

FOREIGN PATENT DOCUMENTS

CN 112992837 A 6/2021
JP 5861260 B2 2/2016
(Continued)

*Primary Examiner* — Peter Dungba Vo
*Assistant Examiner* — Jose K Abraham
(74) *Attorney, Agent, or Firm* — Muncy, Geissler, Olds & Lowe, P.C.

(57) ABSTRACT

The disclosure provides a circuit board assembly, which includes a core layer, an electronic component, a first shielding ring wall, a second shielding ring wall, a first circuit layer, a second circuit layer, a first insulating layer and a plurality of shielding columns. The core layer has an accommodating space, in which the accommodating space has an inner sidewall. The electronic component is disposed in the accommodating space. The first shielding ring wall is disposed in the accommodating space and covers the inner sidewall, in which the first shielding ring wall surrounds the electronic component and is not in contact with the electronic component. The second shielding ring wall is disposed in the core layer and surrounds the first shielding ring wall. The core layer is disposed between the first circuit layer and the second circuit layer. The shielding columns are disposed in the first insulating layer.

8 Claims, 24 Drawing Sheets

(51) Int. Cl.
*H05K 1/02* (2006.01)
*H05K 1/18* (2006.01)

(56) References Cited

U.S. PATENT DOCUMENTS

| | | | | |
|---|---|---|---|---|
| 9,198,296 | B1* | 11/2015 | Lin | ........................ H05K 1/0213 |
| 9,258,908 | B2* | 2/2016 | Chang | ................. H01L 21/4857 |
| 10,729,014 | B2* | 7/2020 | Liao | ........................ H05K 3/465 |
| 10,863,627 | B1* | 12/2020 | Park | ........................ H05K 1/185 |
| 10,881,008 | B1* | 12/2020 | Guo | ........................ H05K 3/462 |
| 10,932,368 | B1* | 2/2021 | Jung | ................... H01L 21/4857 |
| 2018/0146559 | A1* | 5/2018 | Lin | ........................... H01L 24/19 |
| 2018/0197831 | A1 | 7/2018 | Kim et al. | |
| 2019/0124778 | A1* | 4/2019 | Liao | ........................ H05K 3/386 |
| 2019/0296102 | A1* | 9/2019 | Tain | ........................ H01L 28/40 |
| 2021/0059058 | A1* | 2/2021 | Hsu | ...................... H05K 3/4614 |
| 2021/0136926 | A1* | 5/2021 | Guo | ........................ H05K 3/462 |
| 2021/0400801 | A1* | 12/2021 | Li | ........................... H05K 1/024 |
| 2022/0007511 | A1* | 1/2022 | Jeong | ..................... H05K 1/186 |
| 2022/0022310 | A1* | 1/2022 | Park | ........................ H05K 3/22 |

FOREIGN PATENT DOCUMENTS

| | | |
|---|---|---|
| KR | 100879375 B1 | 1/2009 |
| TW | 202006904 A | 2/2020 |
| WO | WO2020/116228 A1 | 6/2020 |

\* cited by examiner

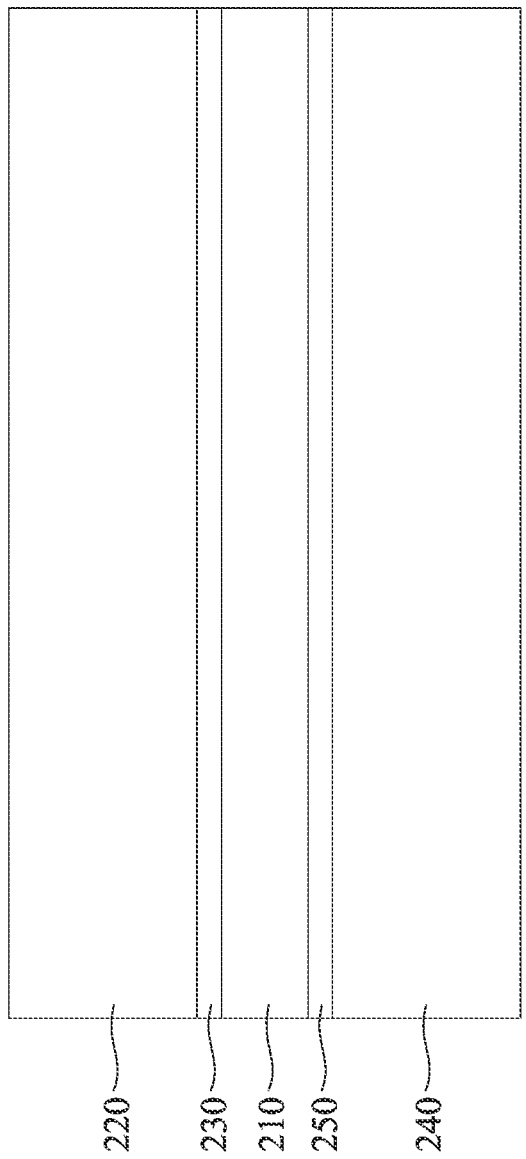

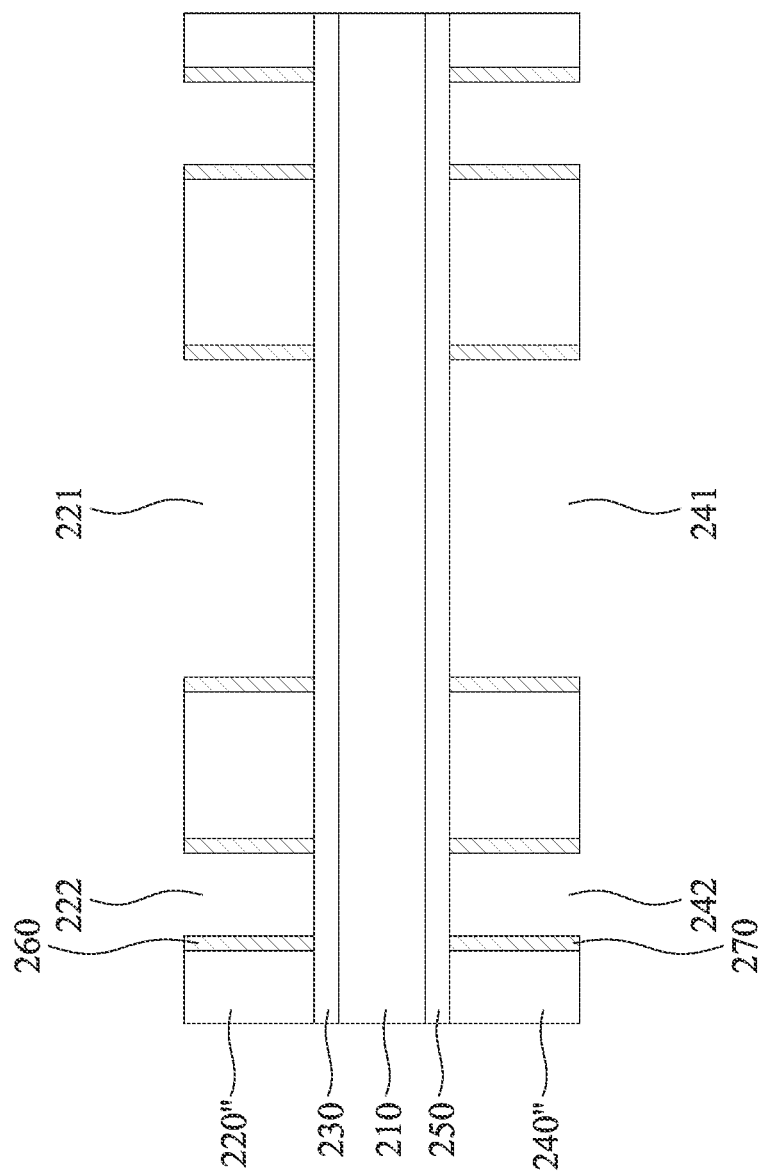

MANUFACTURING METHOD OF CIRCUIT BOARD ASSEMBLY

CROSS-REFERENCE TO RELATED APPLICATION

This application claims priority to China Application Serial Number 202111438219.6, filed on Nov. 30, 2021, which is herein incorporated by reference.

BACKGROUND

Field of Invention

This disclosure relates to a circuit board assembly and a manufacturing method thereof, in particular to a circuit board assembly and a manufacturing method thereof that can effectively shield electromagnetic interference between electronic components.

Description of Related Art

A current chip package, such as System in a Package (SiP), includes a plurality of electronic components. These electronic components generate electromagnetic waves when these electronic components are in operation, and the electromagnetic waves interfere with these electronic components, thereby affecting the operation of these electronic components. In this way, an electronic device equipped with this chip package, such as a smartphone or a tablet, may operate abnormally or even malfunction. Therefore, reducing or avoiding the interference of the electromagnetic waves on the electronic components in the chip package is an issue worthy of discussion.

SUMMARY

A purpose of the present disclosure is to provide a circuit board assembly, which includes a core layer, at least one electronic component, at least one first shielding ring wall, at least one second shielding ring wall, a first circuit layer, a second circuit layer, a first insulating layer and a plurality of shielding columns. The core layer has an accommodating space, in which the accommodating space has an inner sidewall. The electronic component is disposed in the accommodating space. The first shielding ring wall is disposed in the accommodating space and covers the inner sidewall, in which the first shielding ring wall surrounds the electronic component and is not in contact with the electronic component. The second shielding ring wall is disposed in the core layer and surrounds the first shielding ring wall. The core layer is disposed between the first circuit layer and the second circuit layer. The second circuit layer is disposed between the first insulating layer and the core layer. The shielding columns are disposed in the first insulating layer.

In some embodiments, the shielding columns are electrically connected to the first shielding ring wall.

In some embodiments, the circuit board assembly further includes a shielding layer, in which the shielding layer is disposed beneath the first insulating layer, and the first insulating layer is disposed between the shielding layer and the core layer, and the shielding columns extend to the core layer and the shielding layer.

In some embodiments, the second shielding ring wall includes two metal layers and a conductive material, and the metal layers are arranged in concentric rings, and one of the metal layers surrounds the other of the metal layers and the conductive material.

In some embodiments, a surface of the electronic component, one end of the conductive material, and a surface of the core layer are coplanar.

In some embodiments, the height of the second shielding ring wall is greater than the thickness of the at least one electronic component.

In some embodiments, the circuit board assembly further includes a second insulating layer, in which the first circuit layer is disposed between the second insulating layer and the core layer.

In some embodiments, a material of the core layer is a photosensitive dielectric material.

In some embodiments, the circuit board assembly further includes a graphene layer, in which the graphene layer is disposed in the accommodating space and surrounds the electronic component, and the graphene layer is continuously distributed around the electronic component.

In some embodiments, the electronic component is electrically isolated from the first shielding ring wall, the second shielding ring wall, and the shielding columns.

The present disclosure also provides a method of manufacturing a circuit board assembly, which includes providing a substrate. A first dielectric layer and a first release film are formed on the substrate, in which first release film is disposed between the first dielectric layer and the substrate. The first dielectric layer is patterned to form a first dielectric pattern layer, in which the first dielectric pattern layer has at least one first recess and at least one first groove. A first metal layer is formed on the first dielectric pattern layer, in which the first metal layer covers an upper surface of the first dielectric pattern layer, a sidewall of the first recess and a sidewall of the first groove. At least one electronic component is disposed in the at least one first recess, in which the electronic component is disposed on the substrate. A second dielectric pattern layer is disposed on the first dielectric pattern layer and the electronic component after disposing the electronic component in the at least one first recess to form a core layer including the first dielectric pattern layer and the second dielectric pattern layer. At least one circuit layer is formed on the core layer. At least one insulating layer is formed on the circuit layer. A plurality of shielding columns are formed in the insulating layer.

In some embodiments, forming the second dielectric pattern layer includes: while forming the first dielectric layer and the first release film, forming a second dielectric layer and a second release film on another side of the substrate opposite to the first dielectric layer, in which the second release film is disposed between the second dielectric layer and the substrate. The second dielectric layer is patterned to form the second dielectric pattern layer, in which the second dielectric pattern layer has at least one second recess and at least one second groove. A second metal layer is formed on the second dielectric pattern layer, in which the second metal layer covers an upper surface of the second dielectric pattern layer, a sidewall of the second recess and a sidewall of the second groove.

In some embodiments, the method of manufacturing the circuit board assembly further includes filling a plurality of conductive materials in the first groove and the second groove during disposing the electronic component in the at least one first recess, in which the conductive materials protrude from a surface of the first dielectric pattern layer and a surface of the second dielectric pattern layer.

In some embodiments, the method of manufacturing the circuit board assembly further includes after respectively forming the first metal layer and the second metal layer on the first dielectric pattern layer and the second electrical pattern layer, and before disposing the electronic element in the at least one first recess, thinning the first metal layer, the second metal layer, the first dielectric pattern layer, and the second dielectric pattern layer to expose an upper surface of the first dielectric pattern layer and an upper surface of the second dielectric pattern layer.

In some embodiments, patterning the first dielectric layer and the second dielectric layer comprises an exposure process and a development process.

In some embodiments, disposing the second dielectric pattern layer on the first dielectric pattern layer and the electronic component, the second dielectric pattern layer and the first dielectric pattern layer are adhered to each other.

In some embodiments, in the step of disposing the second dielectric pattern layer on the first dielectric pattern layer and the electronic component, the substrate, the first dielectric pattern layer, the second dielectric pattern layer, the electronic component and the conductive materials are in a working environment with a temperature in a range from 25° C. to 180° C.

In some embodiments, the method of manufacturing the circuit board assembly further includes removing the substrate after forming the conductive columns in the insulating layer. At least one build-up circuit layer is formed on the core layer. At least one build-up insulating layer is formed on the build-up circuit layer.

In some embodiments, portions of the conductive columns are disposed in the insulating layer along the first metal layer and the second metal layer adjacent to the electronic component.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2J are schematic cross-sectional views illustrating a method of manufacturing a circuit board assembly at various process stages according to some embodiments of the present disclosure.

DETAILED DESCRIPTION

Figure 1A:
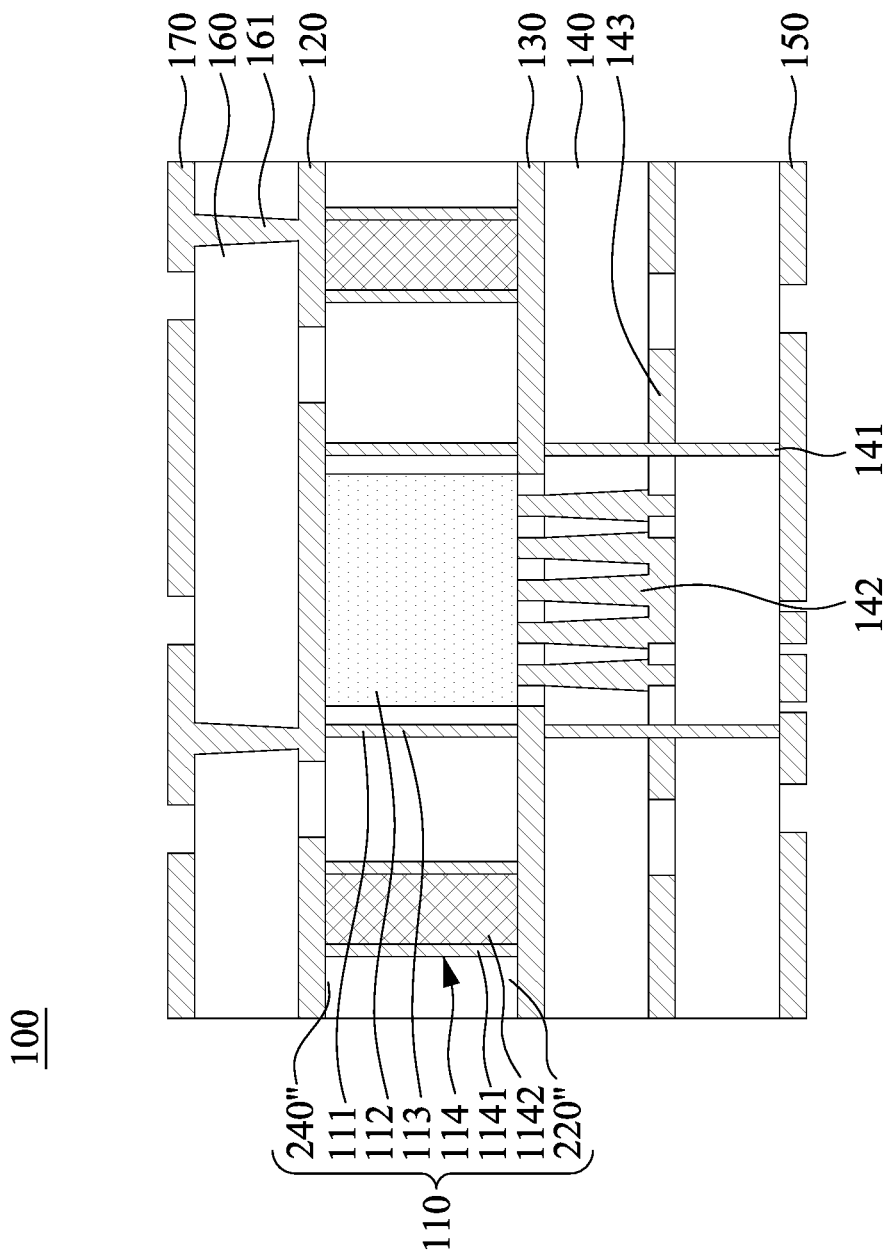
FIG. 1A is a schematic cross-sectional view of a circuit board assembly according to some embodiments of the present disclosure.

The following disclosure provides many different embodiments or examples, for implementing different features of the provided subject matter. Specific examples of elements, values, operations, materials, configurations and the like are described below to simplify the present disclosure. These are, of course, merely examples and are not intended to be limiting. Other elements, values, operations, materials, configurations and the like are also considered. For example, in the following description, forming a first feature on a second feature may include an embodiment in which the first and second features are formed in direct contact, and may also include an embodiment in which an additional feature may be formed between the first and second features, such that the first and second features are not in direct contact. In addition, the present disclosure may repeat reference numerals and/or letters in the various examples. This repetition does not indicate a relationship between the various embodiments and/or configurations discussed.

In addition, spatially relative terms, such as "beneath", "below", "lower", "over", "higher", etc. may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations), and the spatially relative description used herein may likewise be interpreted accordingly.

Generally, the circuit board assembly of the present disclosure can be used in any electronic product or electronic device, and can form a highly integrated circuit board with various components such as radio frequency, digital, optoelectronics, etc. using system in a package, and can avoid electromagnetic wave leakage or interference between the various components.

First, please refer to FIG. 1A. FIG. 1A is a schematic cross-sectional view of a circuit board assembly according to some embodiments of the present disclosure. In some embodiments of the present disclosure, the circuit board assembly 100 includes a core layer 110, at least one electronic component 112, at least one first shielding ring wall 113, at least one second shielding ring wall 114, a first circuit layer 120, a second circuit layer 130, a first insulating layer 140, and a plurality of shielding columns 141. The core layer 110 has at least one accommodating space 111, in which the accommodating space 111 has an inner sidewall. Please note that the inner sidewall is not specially marked in order to avoid too much confusion in the figure. The electronic component 112 is disposed in the accommodating space 111. The first shielding ring wall 113 is disposed in the accommodating space 111 and covers the inner sidewall, in which the first shielding ring wall 113 surrounds the electronic component 112, and the first shielding ring wall 113 is not in contact with the electronic component 112. The second shielding ring wall 114 is disposed in the core layer 110 and surrounds the first shielding ring wall 113. In one embodiment, a material of the core layer 110 is a photosensitive dielectric material. In some embodiments, a material of the core layer 110 includes, but is not limited to, a photosensitive dielectric material such as photosensitive polyimide (PSPI), photoimageable coverlay (PIC), or a combination thereof. Specifically, the first shielding ring wall 113 is not in contact with the electronic component 112 means that there is an annular space between the first shielding ring wall 113 and the electronic component 112 to electrically separate the first shielding ring wall 113 and the electronic component 112. In addition, the use of the photosensitive dielectric material can support components having different sizes and form a corresponding chamber or an accommodating space. In the case of a given size space, more components may be stacked in a vertical direction, and thus the integration could be higher.

The core layer 110 may have more than one electronic component 112, and when there are a plurality of electronic components 112, each of the electronic components 112 is surrounded by a corresponding first shielding ring wall 113. It should be noted that FIG. 1A shows one electronic component 112 and one first shielding ring wall 113, which are only exemplary, and it is not limited thereto. Specifically, the first shielding ring wall 113 preliminarily shields or blocks electromagnetic waves leaking from the electronic component 112 to remove most of the electromagnetic wave interference. In one embodiment, the electronic component 112 may include, but is not limited to, an active component, a passive component, a high-frequency component, a digital component, an optoelectronic component, or a combination thereof. In one embodiment, a material of the first shielding ring wall 113 includes, but is not limited to, a conductive metal such as copper, gold, silver, nickel, a conductive alloy, or a combination thereof.

Figure 1B:
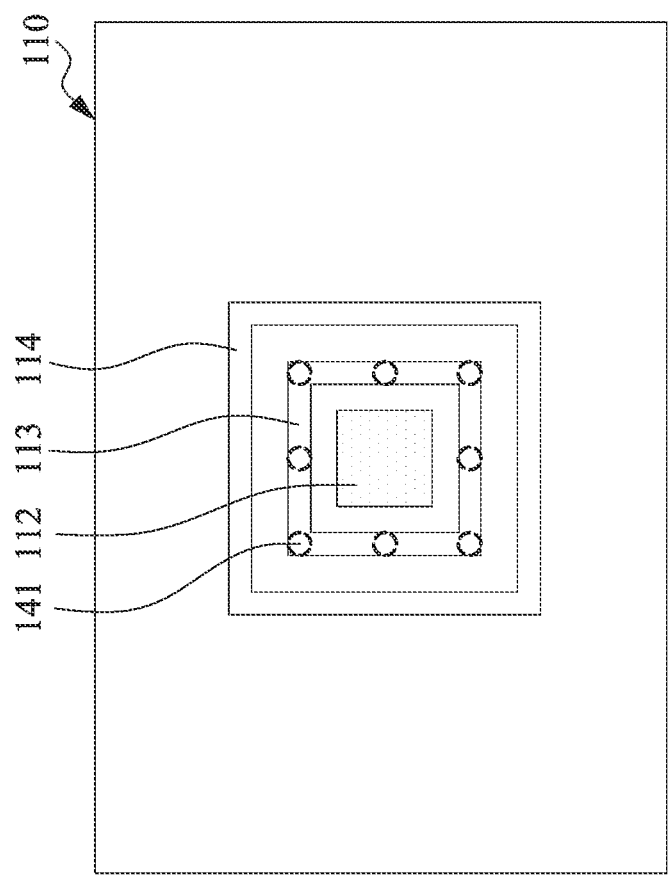
FIG. 1B is a schematic top view of a core layer, an electronic component, a first shielding ring wall, a second shielding ring wall, and a shielding column according to FIG. 1A.

Please refer to FIG. 1B first. FIG. 1B is a schematic top view of a core layer, an electronic component, a first shielding ring wall, a second shielding ring wall, and a shielding column according to FIG. 1A. In some embodiments, the second shielding ring wall 114 is disposed in the core layer 110 and surrounds the first shielding ring wall 113. The relationship between the first shielding ring wall 113 and the second shielding ring wall 114 can be clearly seen from FIG. 1B. Specifically, the second shielding ring wall 114 is not directly in contact with the first shielding ring wall 113, and the second shielding ring wall 114 and the first shielding ring wall 113 are substantially concentrically disposed.

Please continue to refer to FIG. 1A. In some embodiments, the second shielding ring wall 114 includes two metal layers 1141 and a conductive material 1142. The two metal layers 1141 are arranged in concentric rings, and one of the metal layers 1141 surrounds the other of the metal layers 1141 and the conductive material 1142. Specifically, two ends of the second shielding ring wall 114 extend to upper and lower surfaces of the core layer 110. The second shielding ring wall 114 can shield or block electromagnetic waves leaking due to a gap difference between the components when there is a size difference between the electronic components 112. Specifically, the gap differences are caused by the portions of vertical embedded components on which copper is not deposited or plated. Moreover, for a circuit board, the numbers and types of the embedded components in each position are different, and the gap differences are also different, but each of the gap differences is less than the overall thickness of the circuit board. As such, with the arrangement of the first shielding ring wall 113, most of the electromagnetic waves leaking from the top, bottom, left, and right of the electronic component 112 are almost shielded. In addition, the metal layers 1141 in the second shielding ring wall 114 can increase rigidity of the circuit board assembly 100. In one embodiment, a material of the two metal layers 1141 of the second shielding ring wall 114 includes, but is not limited to, a conductive metal such as copper, gold, silver, nickel, a conductive alloy, or a combination thereof. In one embodiment, a conductive material 1142 of the second shielding ring wall 114 includes, but is not limited to, copper, gold, silver, nickel, or a metal alloy of a combination thereof.

Please continue to refer to FIG. 1A, the core layer 110 is disposed between the first circuit layer 120 and the second circuit layer 130. Specifically, the electronic component 112 in the core layer 110 should be electrically connected to outside. Therefore, the first circuit layer 120 and the second circuit layer 130 are disposed on the upper and lower surfaces of the core layer 110, and thus the electronic component 112 can be electrically connected to the outside. In addition, the second circuit layer 130 is disposed between the first insulating layer 140 and the core layer 110. The shielding column 141 is provided in the first insulating layer 140. In addition, a plurality of conductive columns 142 are also disposed in the first insulating layer 140, and the conductive columns 142 are electrically connected to the electronic component 112. In one embodiment, the shielding column 141 is electrically connected to the first shielding ring wall 113 and extends to upper and lower surfaces of the first insulating layer 140. Furthermore, the shielding columns 141 surround the conductive columns 142.

Referring to FIG. 1B at the same time, the shielding columns 141 are arranged along the first shielding ring wall 113. As such, when the conductive columns 142 beneath the electronic component 112 as lead-through portions have current flowing and generate an electromagnetic field, the shielding column 141 can shield the electromagnetic field generated by the current. However, it should be noted that FIG. 1B shows eight shielding columns 141, which are only exemplary, and it is not limited thereto. More or less shielding columns 141 should be included in the scope of the present disclosure. At the same time, the shielding column 141 is disposed in a column shape, which is different from the first shielding ring wall 113 and the second shielding ring wall 114, so that the conductive column 142 can further circulate with an external circuit. In some embodiments, a material of the shielding columns 141 and a material of the conductive columns 142 include, but are not limited to, a conductive metal such as copper, gold, silver, nickel, a conductive alloy, or a combination thereof.

In some embodiments, the electronic component 112 is electrically isolated from the first shielding ring wall 113, the second shielding ring wall 114, and the shielding column 141. As such, the first shielding ring wall 113, the second shielding ring wall 114, and the shielding column 141 will not affect the electrical flow or function between the electronic component 112 and the external circuit.

In some embodiments, the circuit board assembly 100 further includes a shielding layer 150, in which the shielding layer 150 is disposed beneath the first insulating layer 140, and the first insulating layer 140 is disposed between the shielding layer 150 and the core layer 110, and the shielding column 141 extends to the core layer 110 and the shielding layer 150. Specifically, the shielding layer 150 is disposed on a surface of the first insulating layer 140 opposite to the core layer 110, and the shielding layer 150 is perpendicular to a center line of the conductive column 142, which can enhance the shielding performance of the electromagnetic field. In one embodiment, the shielding layer 150 may not be provided, and a thick copper layer may be used instead, so that heat dissipation efficiency of the circuit board assembly 100 can be increased. In one embodiment, metal wiring may also be used to replace the shielding layer 150, so that the electronic component 112 can be further electrically connected with more electronic devices.

In addition, in one embodiment, the first insulating layer 140 may also have a multi-layer structure, and the layers are connected by a build-up circuit layer 143 and the conductive column 142.

Still referring to FIG. 1A, a surface of the electronic component 112, one end of the second shielding ring wall 114, and a surface of the core layer 110 are coplanar. Specifically, the second shielding ring wall 114 extends to the upper and lower surfaces of the core layer 110, so that the electromagnetic waves leaking from the electronic component 112 due to the gap difference can be completely shielded.

In one embodiment, the circuit board assembly 100 further includes a second insulating layer 160, a wiring layer 170, and a plurality of conductive columns 161, and the first circuit layer 120 is disposed between the second insulating layer 160 and the core layer 110. The wiring layer 170 is disposed on the second insulating layer 160, and the conductive column 161 extends to the core layer 110 and the wiring layer 170.

It should be noted that a manufacturing method and a process flow of the circuit board assembly 100 as shown in FIG. 1A will be detailed in subsequent paragraphs.

Figure 3A:
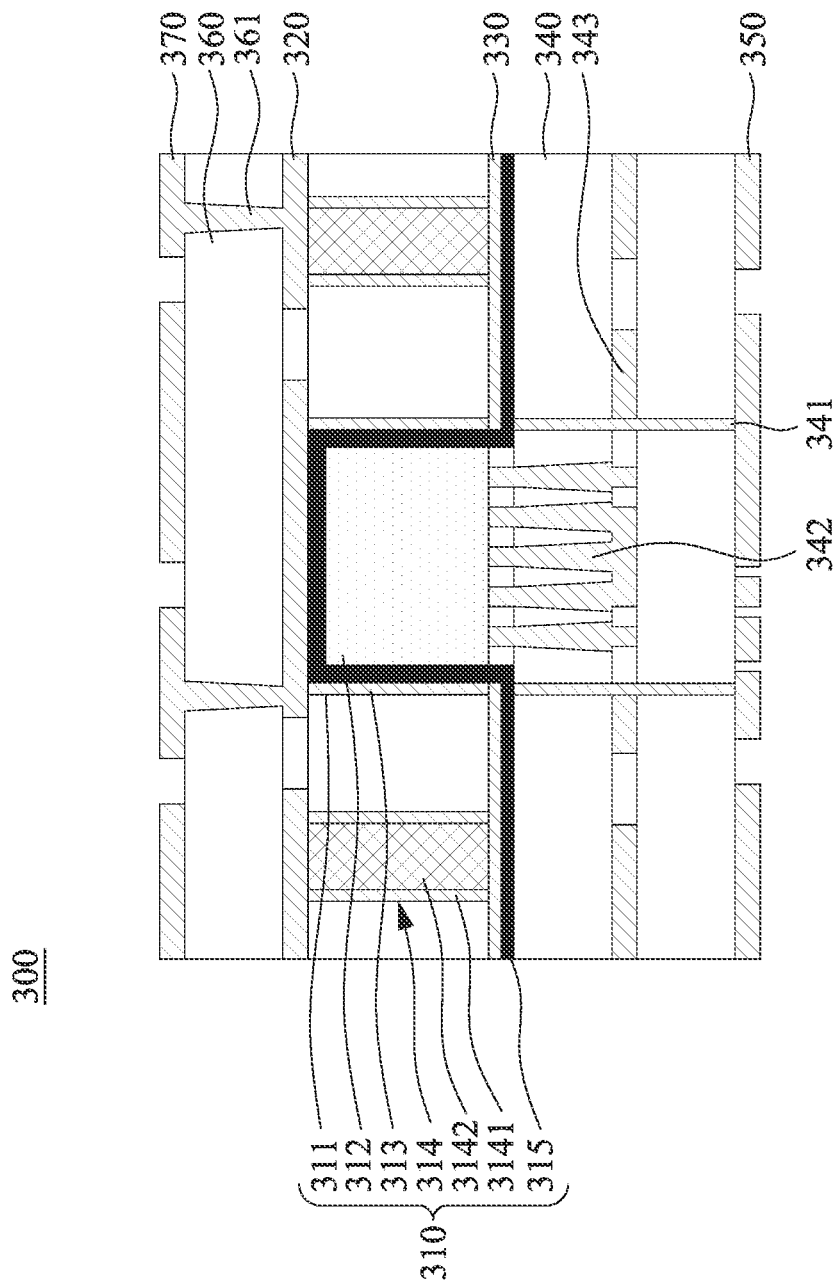
FIG. 3A is a schematic cross-sectional view of a circuit board assembly according to other embodiments of the present disclosure.

Please refer to FIG. 3A. FIG. 3A is a schematic cross-sectional view of a circuit board assembly according to other embodiments of the present disclosure. As shown in FIG. 3A, the biggest difference between this embodiment and the circuit board assembly 100 of FIG. 1A is that a core layer 310 of a circuit board assembly 300 of this embodiment further includes a graphene layer 315. It should be particularly noted that an overall structure of the circuit board assembly 300 in FIG. 3A is similar to that of the circuit board assembly 100 in FIG. 1A. The circuit board assembly 300 includes the core layer 310, at least one electronic component 312, and at least one first shielding ring wall 313, at least one second shielding ring wall 314, a first circuit layer 320, a second circuit layer 330, a first insulating layer 340, and a plurality of shielding columns 341. The core layer 310 has at least one accommodating space 311, in which the accommodating space 311 has an inner sidewall. The electronic component 312 is disposed in the accommodating space 311. The first shielding ring wall 313 is disposed in the accommodating space 311 and covers the inner sidewall, in which the first shielding ring wall 313 surrounds the electronic component 312, and the first shielding ring wall 313 is not in contact with the electronic component 312. The second shielding ring wall 314 is disposed in the core layer 310 and surrounds the first shielding ring wall 313. The second shielding ring wall 314 includes two metal layers 3141 and a conductive material 3142. The two metal layers 3141 are arranged in concentric rings, and one of the metal layers 3141 surrounds the other of the metal layers 3141 and the conductive material 3142. The core layer 310 is disposed between the first circuit layer 320 and the second circuit layer 330. The second circuit layer 330 is disposed between the first insulating layer 340 and the core layer 310. The shielding column 341 is disposed in the first insulating layer 340. In addition, a plurality of conductive columns 342 are also disposed in the first insulating layer 340, and the conductive columns 342 are electrically connected to the electronic component 312. The shielding columns 341 are arranged along the first shielding ring wall 313. The circuit board assembly 300 further includes a shielding layer 350, in which the shielding layer 350 is disposed beneath the first insulating layer 340, and the first insulating layer 340 is disposed between the shielding layer 350 and the core layer 310, and the shielding column 341 extends to the core layer 310 and shielding layer 350. The circuit board assembly 300 further includes a second insulating layer 360, a wiring layer 370 and a plurality of conductive columns 361, and the first circuit layer 320 is disposed between the second insulating layer 360 and the core layer 310. The wiring layer 370 is disposed on the second insulating layer 360, and the conductive columns 361 extend to the core layer 310 and the wiring layer 370.

Materials of all the components in the circuit board assembly 300 described above are the same as those of the circuit board assembly 100 in FIG. 1A, and will not be repeated here.

In some embodiments, the graphene layer 315 is disposed in the accommodating space 311 and surrounds the electronic component 312, and the graphene layer 315 is continuously distributed around the electronic component 312. Specifically, the graphene layer 315 is disposed between the electronic element 312 and the first shielding ring wall 313, between the electronic element 312 and the first circuit layer 320, and between the second circuit layer 330 and the first insulating layer 340, and the graphene layer 315 is a continuous structure. When the graphene layer 315 is disposed in the accommodating space 311, the graphene layer 315 can improve heat dissipation efficiency of the circuit board assembly 300.

Figure 3B:
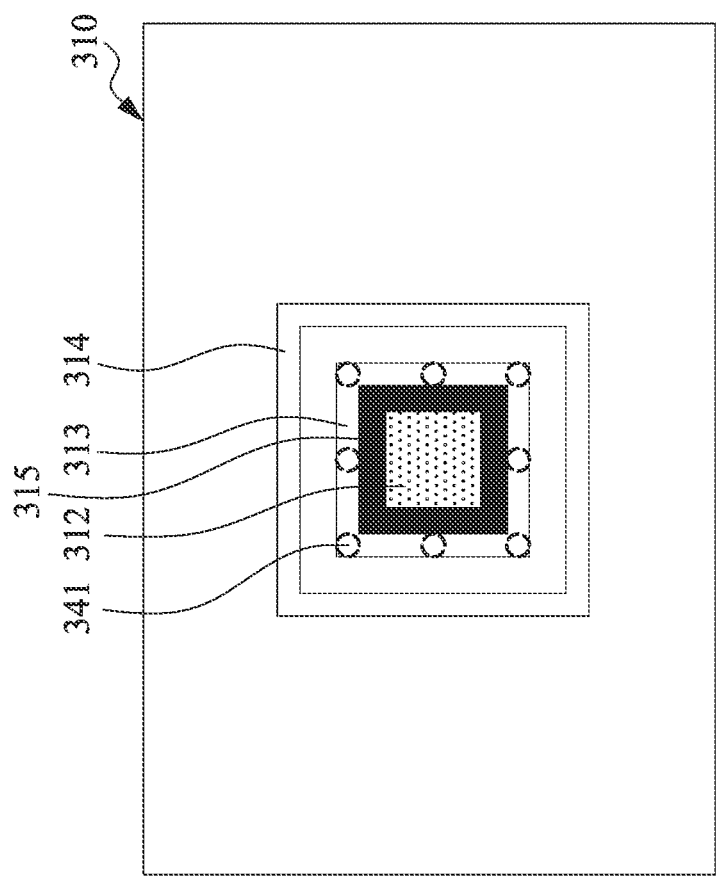
FIG. 3B is a schematic top view of a core layer, an electronic component, a first shielding ring wall, a second shielding ring wall, a shielding column, and a graphene layer according to FIG. 3A.

Please refer to FIG. 3B first. FIG. 3B is a schematic top view of the core layer, the electronic component, the first shielding ring wall, the second shielding ring wall, the shielding column, and the graphene layer according to FIG. 3A. It can be clearly understood from FIG. 3B that the graphene layer 315 is disposed between the first shielding ring wall 313 and the electronic component 312 and covers the electronic component 312, so that the heat dissipation efficiency of the electronic component 312 can be improved.

It should be noted that a manufacturing method and a process flow of the circuit board assembly 300 as shown in FIG. 3A will be detailed in subsequent paragraphs.

Figure 5A:
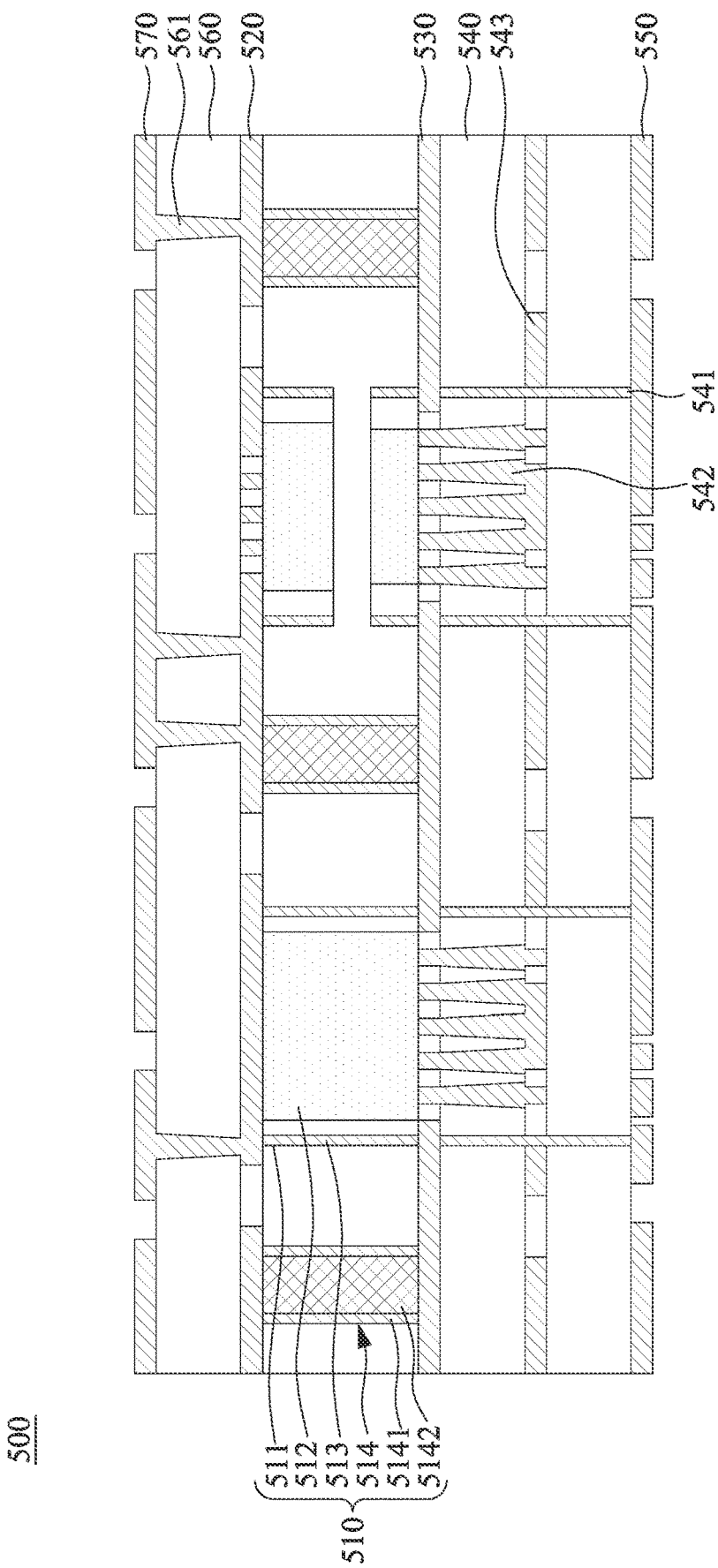
FIG. 5A is a schematic cross-sectional view of a circuit board assembly according to still other embodiments of the present disclosure.

Please refer to FIG. 5A. FIG. 5A is a schematic cross-sectional view of a circuit board assembly according to still other embodiments of the present disclosure. Specifically, FIG. 5A shows a circuit board assembly 500 having a plurality of electronic components 512.

The circuit board assembly 500, a core layer 510, the electronic components 512, a first shielding ring wall 513, a second shielding ring wall 514, a metal layer 5141, a conductive material 5142, a first circuit layer 520, a second circuit layer 530, a first insulating layer 540, a shielding column 541, a conductive column 542, a build-up circuit layer 543, a shielding layer 550 (or a thick copper layer, a metal wiring), a second insulating layer 560, a conductive column 561 and a wiring layer 570 shown in FIG. 5A, a structural feature and a material of each of the components are the same as the circuit board assemblies 100 and 300 shown in FIG. 1A and FIG. 3A, so these components will not be repeated here.

Specifically, FIG. 5A shows three electronic components 512. Different electronic components 512 in the vertical direction are separated by a photosensitive dielectric material. Therefore, there will be a gap difference between the electronic components 512, and electromagnetic waves will leak out. Accordingly, the second shielding ring wall 514 can shield and block the electromagnetic waves leaking out, and prevent the electronic components 512 from interfering with each other.

Figure 5B:
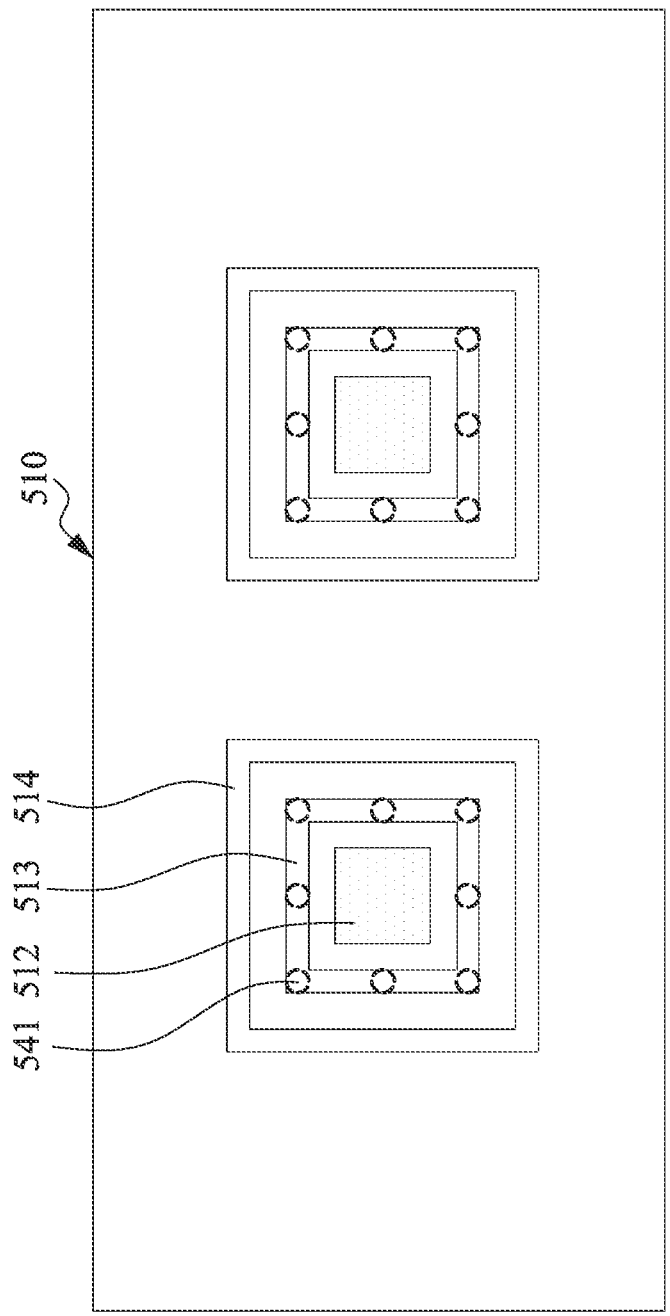
FIG. 5B is a schematic top view of a core layer, an electronic component, a first shielding ring wall, a second shielding ring wall, and a shielding column according to FIG. 5A.

Please refer to FIG. 5B. FIG. 5B is a schematic top view of the core layer, the electronic component, the first shielding ring wall, the second shielding ring wall, and the shielding column according to FIG. 5A. It can also be found from FIG. 5B that the first shielding ring wall 513 is not in contact with the electronic component 512, so that the electrical isolation between the first shielding ring wall 513 and the electronic component 512 is maintained.

It should be noted that a manufacturing method and a process flow of the circuit board assembly 500 as shown in FIG. 5A will be detailed in subsequent paragraphs.

Figure 7:
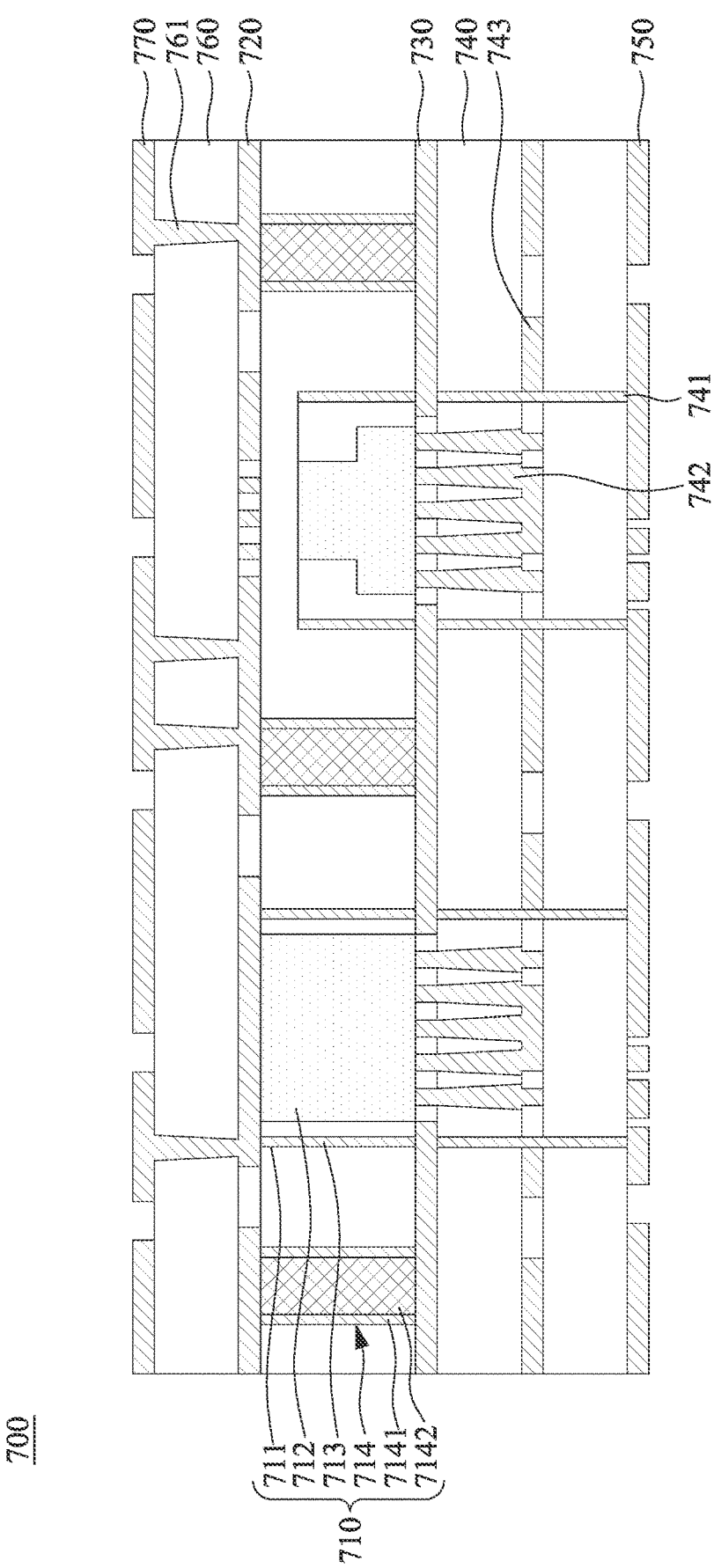
FIG. 7 is a schematic cross-sectional view of a circuit board assembly according to still other embodiments of the present disclosure.

Please refer to FIG. 7. FIG. 7 is a schematic cross-sectional view of a circuit board assembly according to still other embodiments of the present disclosure. A circuit board assembly 700, a core layer 710, an electronic component 712, a first shielding ring wall 713, a second shielding ring wall 714, a metal layer 7141, a conductive material 7142, a first circuit layer 720, a second circuit layer 730, a first insulating layer 740, a shielding column 741, a conductive column 742, a build-up circuit layer 743, a shielding layer 750 (or a thick copper layer, a metal wiring), a second insulating layer 760, a conductive column 761 and a wiring layer 770 shown in FIG. 7, a structural feature and a material of each of the components are the same as the circuit board assemblies 100 and 300 shown in FIG. 1A and FIG. 3A, so these components will not be repeated here.

Specifically, FIG. 7 shows two electronic components 712, and an upper surface of one of the electronic components 712 is not in contact with an upper surface of the core layer 710. In one embodiment, the height of the second shielding ring wall 714 is greater than the thickness of the electronic component 712 which is not in contact with the upper surface of the core layer 710. Accordingly, the second shielding ring wall 714 can prevent the electromagnetic waves leaking from the electronic component 712 having the gap difference, and keep the electronic components 712 from interfering with each other.

Hereinafter, the manufacturing method and the process flow of the circuit board assembly 100 of the embodiment shown in FIG. 1A will be described in detail.

Figure 2B:
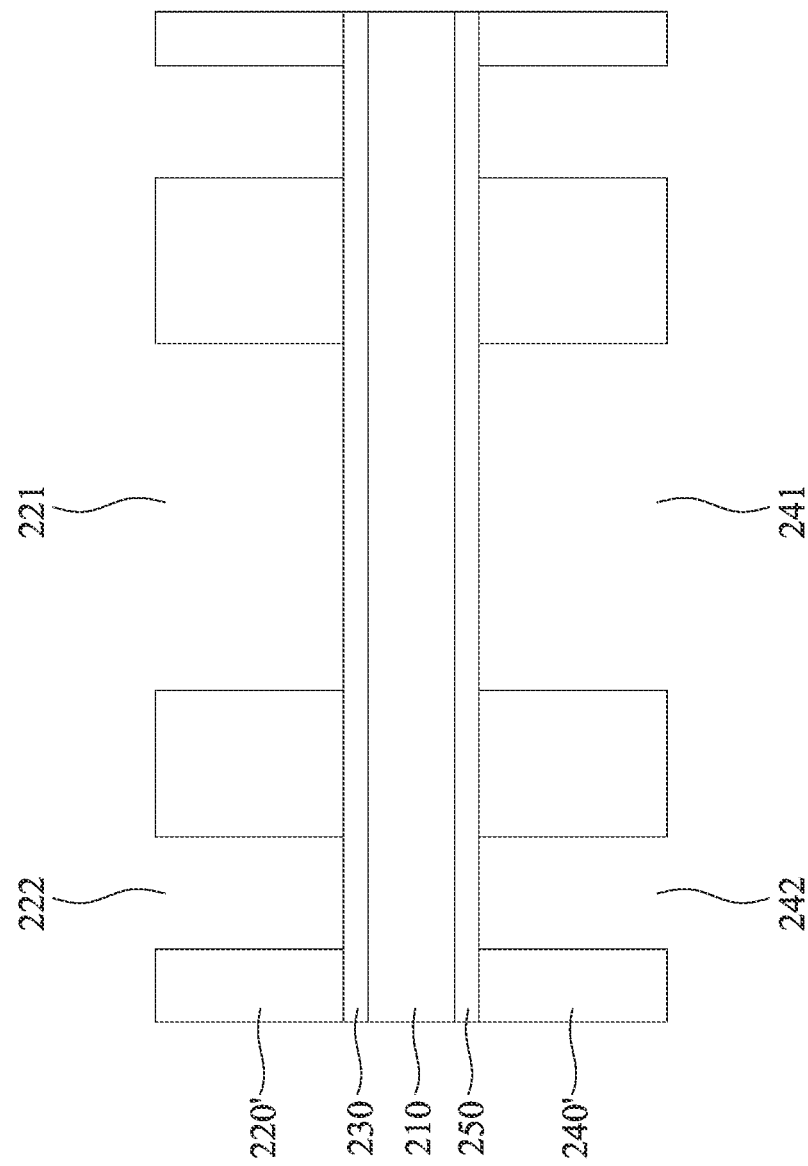

Please refer to FIGS. 2A to 2J. FIGS. 2A to 2J are schematic cross-sectional views illustrating a method of manufacturing a circuit board assembly at various process stages according to some embodiments of the present disclosure. Firstly, as shown in FIG. 2A, a substrate 210 is provided, and a first dielectric layer 220 and a first release film 230, and a second dielectric layer 240 and a second release film 250 are formed on both sides (i.e., upper and lower surfaces) of the substrate 210, respectively. The first release film 230 is disposed between the first dielectric layer 220 and the substrate 210, and the second release film 250 is disposed between the second dielectric layer 240 and the substrate 210. Specifically, the first release film 230 and the second release film 250 are provided to facilitate separation of the first dielectric layer 220 and the second dielectric layer 240 in subsequent processes. In one embodiment, a material of the first dielectric layer 220 and a material of the second dielectric layer 240 include, but are not limited to, a photosensitive dielectric material such as photosensitive polyimide (PSPI), photoimageable coverlay (PIC) or a combination thereof.

Referring to FIG. 2B, the first dielectric layer 220 and the second dielectric layer 240 are patterned to form a first dielectric pattern layer 220' and a second dielectric pattern layer 240'. The first dielectric pattern layer 220' has a first recess 221 and a first groove 222, and the second dielectric pattern layer 240' has a second recess 241 and a second groove 242. Specifically, the first dielectric pattern layer 220' and the second dielectric pattern layer 240' are used as structural package components. In one embodiment, a method of patterning the first dielectric layer 220 and the second dielectric layer 240 includes, but is not limited to, an exposure process and a development process.

Figure 2C:
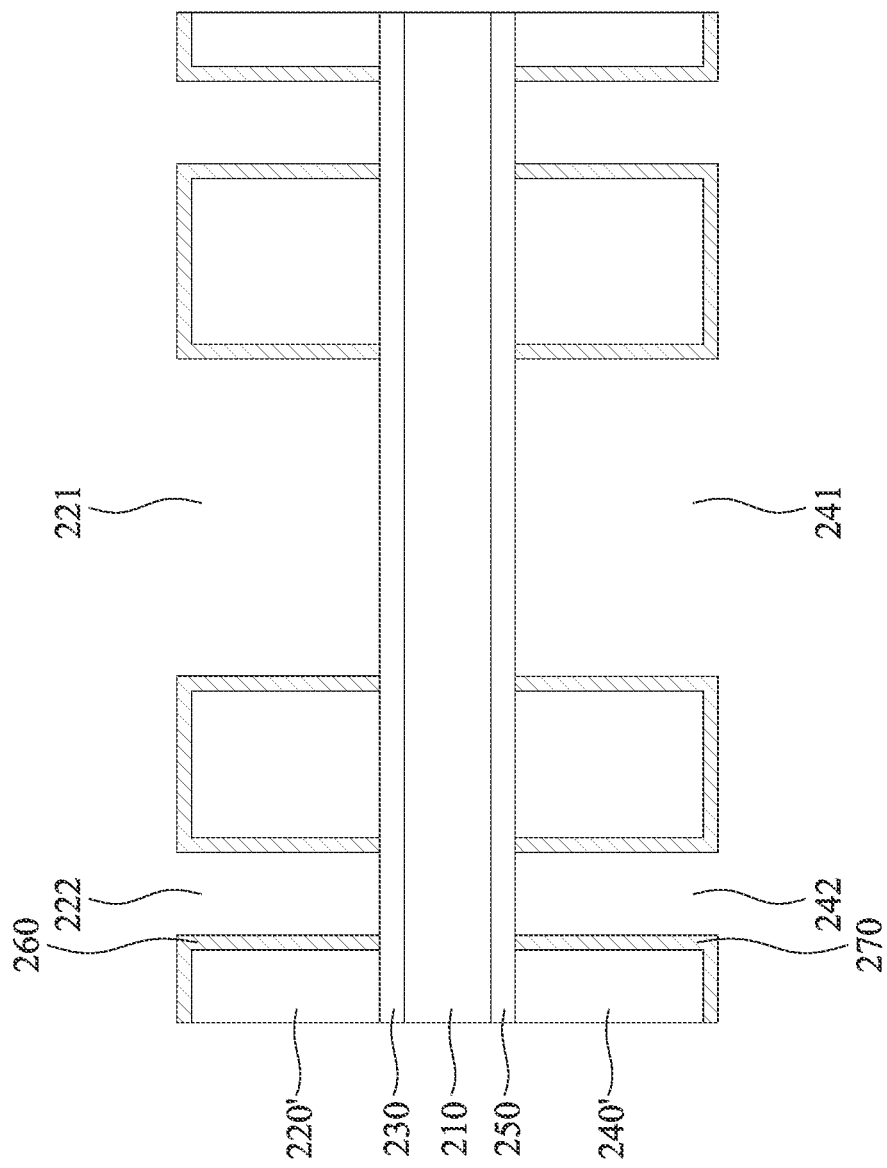

As shown in FIG. 2C, a first metal layer 260 is formed on the first dielectric pattern layer 220', in which the first metal layer 260 covers an upper surface of the first dielectric pattern layer 220', a sidewall of the first recess 221 and a sidewall of the first groove 222. In addition, a second metal layer 270 is formed on the second dielectric pattern layer 240', in which the second metal layer 270 covers an upper surface of the second dielectric pattern layer 240', a sidewall of the second recess 241 and a sidewall of the second groove 242. In one embodiment, a method of forming the first metal layer 260 and the second metal layer 270 includes, but is not limited to, a deposition process, an electroplating process, a coating process, or a combination thereof. In one embodiment, a material for forming the first metal layer 260 and a material for forming the second metal layer 270 include, but are not limited to, a conductive metal such as copper, gold, silver, nickel, a conductive alloy, or a combination thereof.

Referring to FIG. 2D, the first metal layer 260, the second metal layer 270, the first dielectric pattern layer 220', and the second dielectric pattern layer 240' are thinned to form a first dielectric pattern layer 220", a second dielectric pattern layer 240", a first metal pattern layer 260' and a second metal pattern layer 270' exposing upper surfaces thereof. In one embodiment, a method of thinning the first metal layer 260, the second metal layer 270, the first dielectric pattern layer 220', and the second dielectric pattern layer 240' includes, but is not limited to, an etching process, an exposure process and a development process.

Figure 2E:
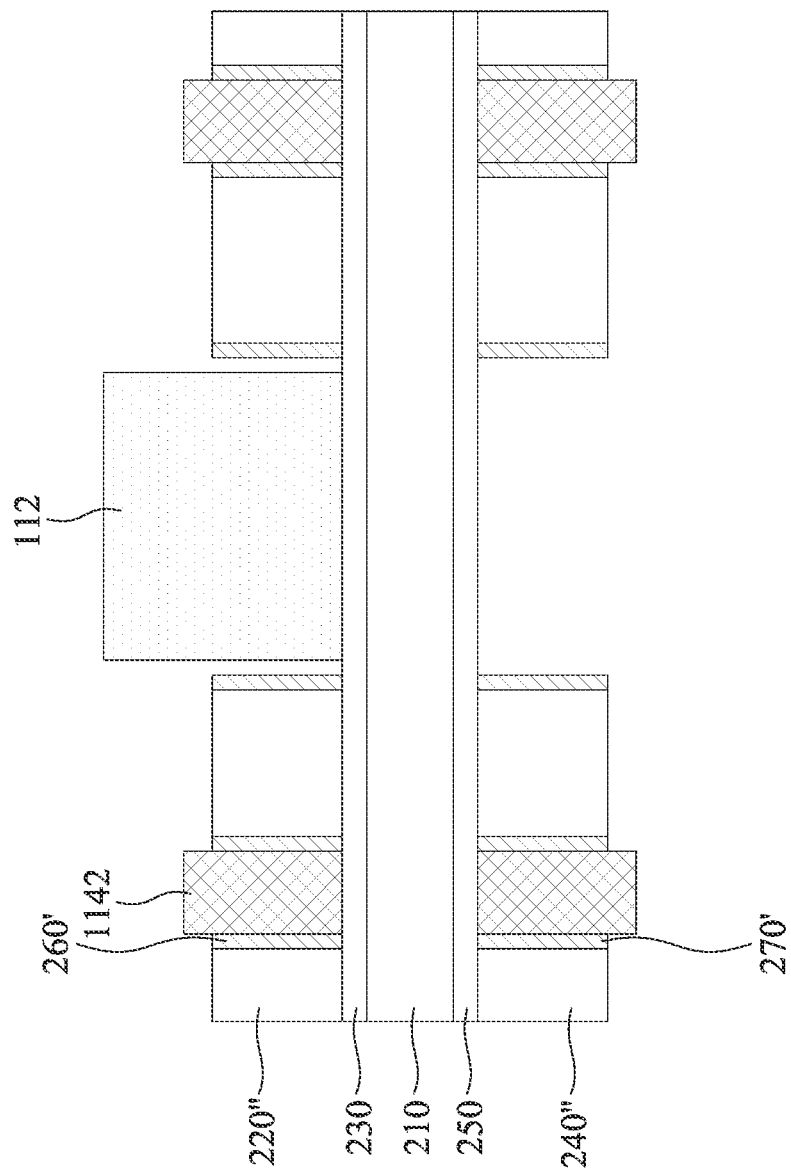

As shown in FIG. 2E, an electronic component 112 is disposed in the first recess 221, and the electronic component 112 is located on the substrate 210. It should be noted that the electronic component 112 is not in contact with the metal pattern layer 260' on the sidewall of the first recess 221, and thus to prevent the electronic element 112 from being electrically connected to the first metal pattern layer 260'. At the same time, a plurality of conductive materials 1142 are filled in the first groove 222 and the second groove 242. It should be noted that the conductive materials 1142 protrude from a surface of the first dielectric pattern layer 220" and a surface of the second dielectric pattern layer 240". Accordingly, in a subsequent stacking process, the first dielectric pattern layer 220" and the second dielectric pattern layer 240" can be completely bonded.

Figure 2F:
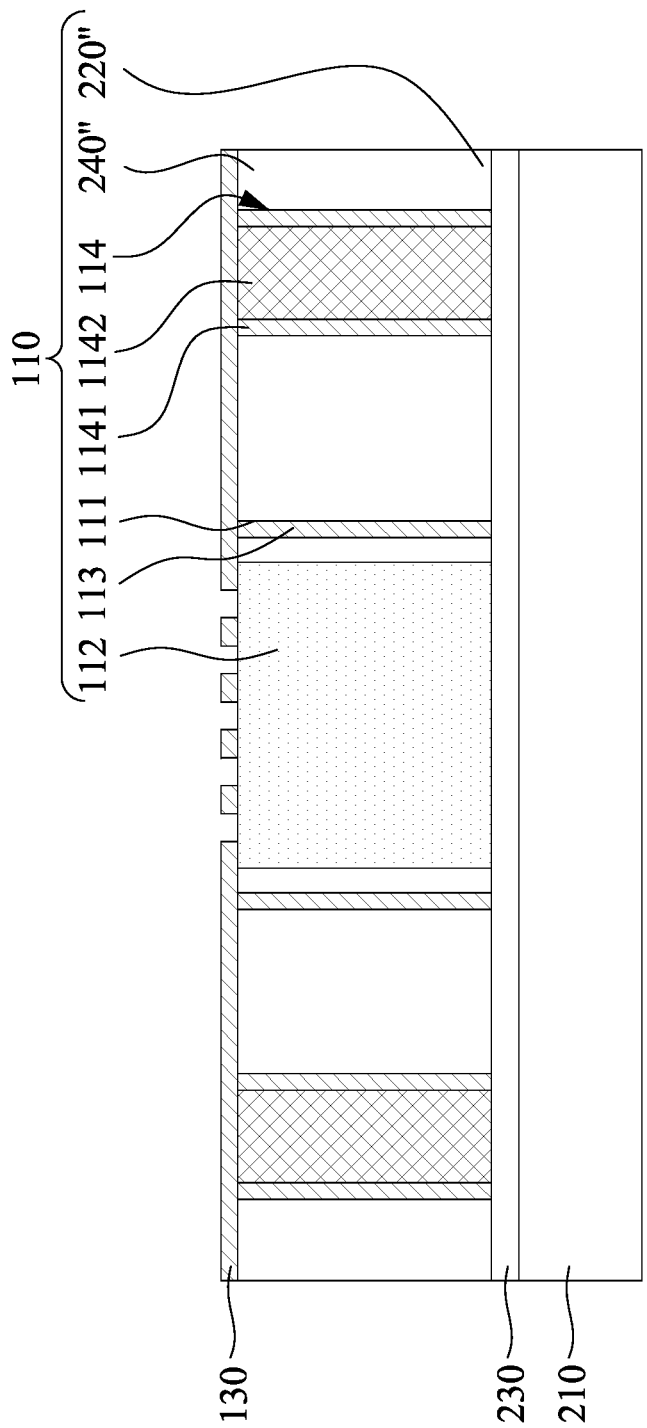

Please refer to FIG. 2F, the second dielectric pattern layer 240" is separated from the substrate 210 by the second release film 250, and is further stacked on the first dielectric pattern layer 220" and the electronic element 112. As such, the first metal pattern layer 260' and the second metal pattern layer 270' are bonded, and the conductive materials 1142 are also bonded to each other, and thus forming a first shielding ring wall 113 and a second shielding ring wall 114. Accordingly, the core layer 110 shown in FIG. 1A is formed. When the second dielectric pattern layer 240" is stacked on the first dielectric pattern layer 220" and the electronic element 112, the first dielectric pattern layer 220" and the second dielectric pattern layer 240" are adhered to each other. Next, a second circuit layer 130 is formed on the core layer 110. Specifically, the second circuit layer 130 is formed by electroplating or metal deposition and then etching.

In one embodiment, during the process of adhering the first dielectric pattern layer 220" and the second dielectric pattern layer 240" to each other, a temperature of a working environment is in a range from 25° C. to 180° C., and thus can prevent the core layer 110 from expanding and deforming due to heating or overheating, which leads to damage.

Figure 2G:
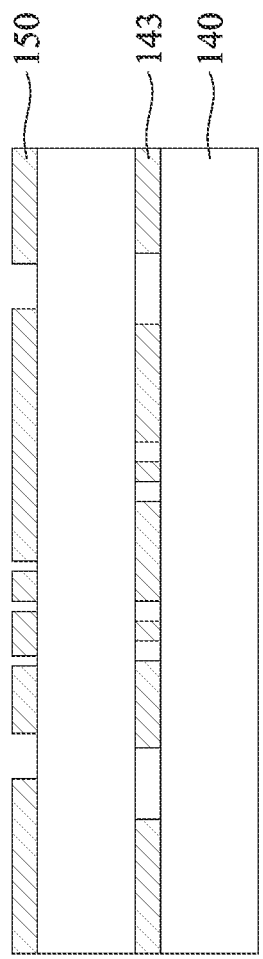

Please refer to FIG. 2G, a first insulating layer 140 is fabricated, and a shielding layer 150 is formed on a surface thereof (a thick copper layer or a metal wiring can also be formed), and a build-up circuit layer 143 is formed in the first insulating layer 140. In one embodiment, a method of forming the shielding layer 150 (or the thick copper layer, the metal wiring) includes, but is not limited to, a deposition process, an electroplating process, a coating process, or a combination thereof.

Figure 2H:
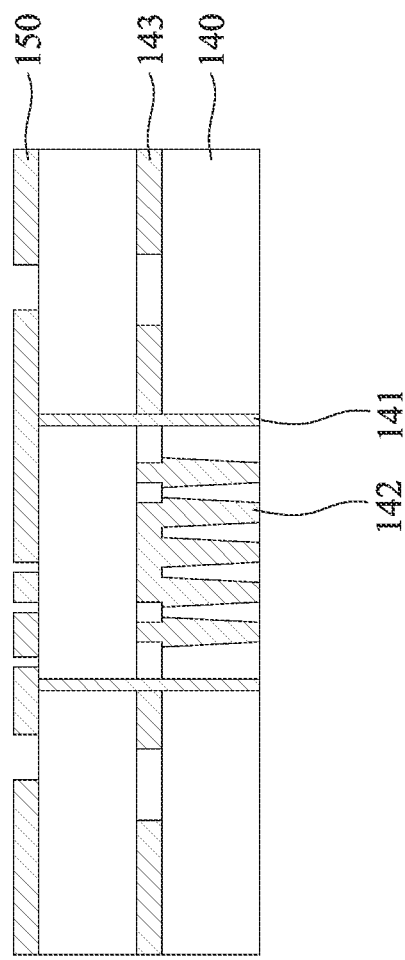
Figure 21:
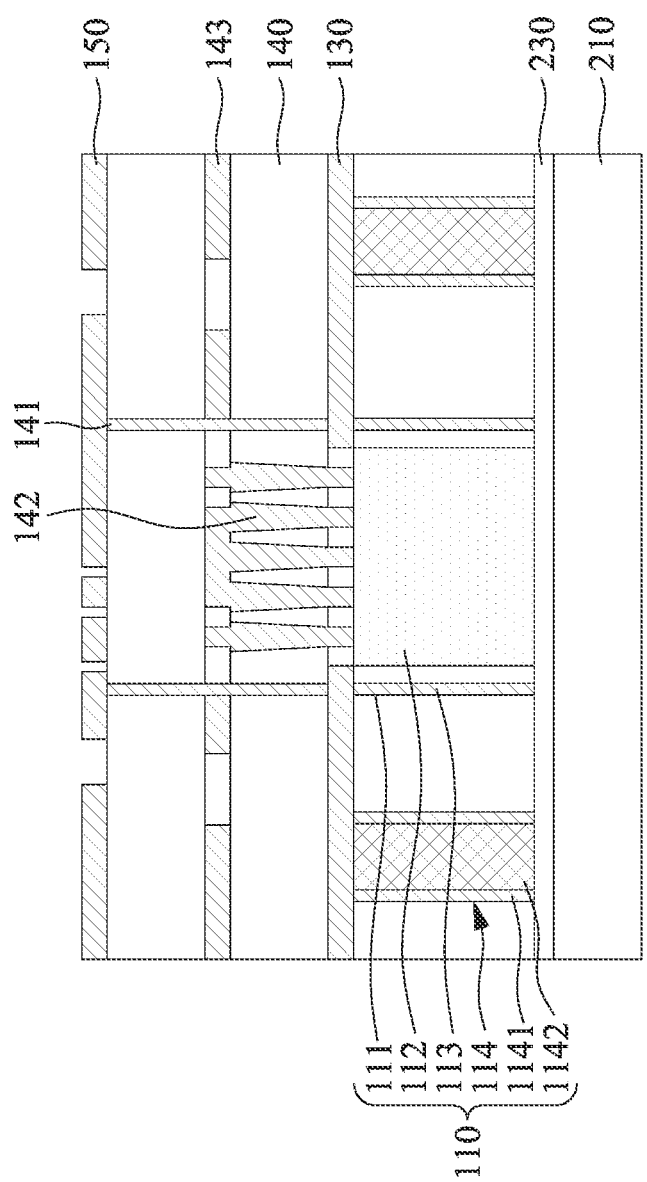

As shown in FIG. 2H, a plurality of shielding columns 141 and a plurality of conductive columns 142 are formed in the first insulating layer 140, and the shielding columns 141 extend to upper and lower surfaces of the first insulating layer 140, and the conductive columns 142 are surrounded by the shielding columns 141. In one embodiment, a method of forming the shielding columns 141 and the conductive columns 142 includes, but is not limited to, a drilling process and a deposition process.

Referring to FIG. 2I, the first insulating layer 140 shown in FIG. 2H is stacked on the core layer 110. It should be noted that this step is to adhere a surface of the first insulating layer 140 that the shielding layer 150 is not disposed and the core layer 110 to each other. As such, the shielding columns 141 are electrically connected to the first shielding ring wall 113, and the conductive columns 142 are electrically connected to the electronic component 112.

Figure 2J:
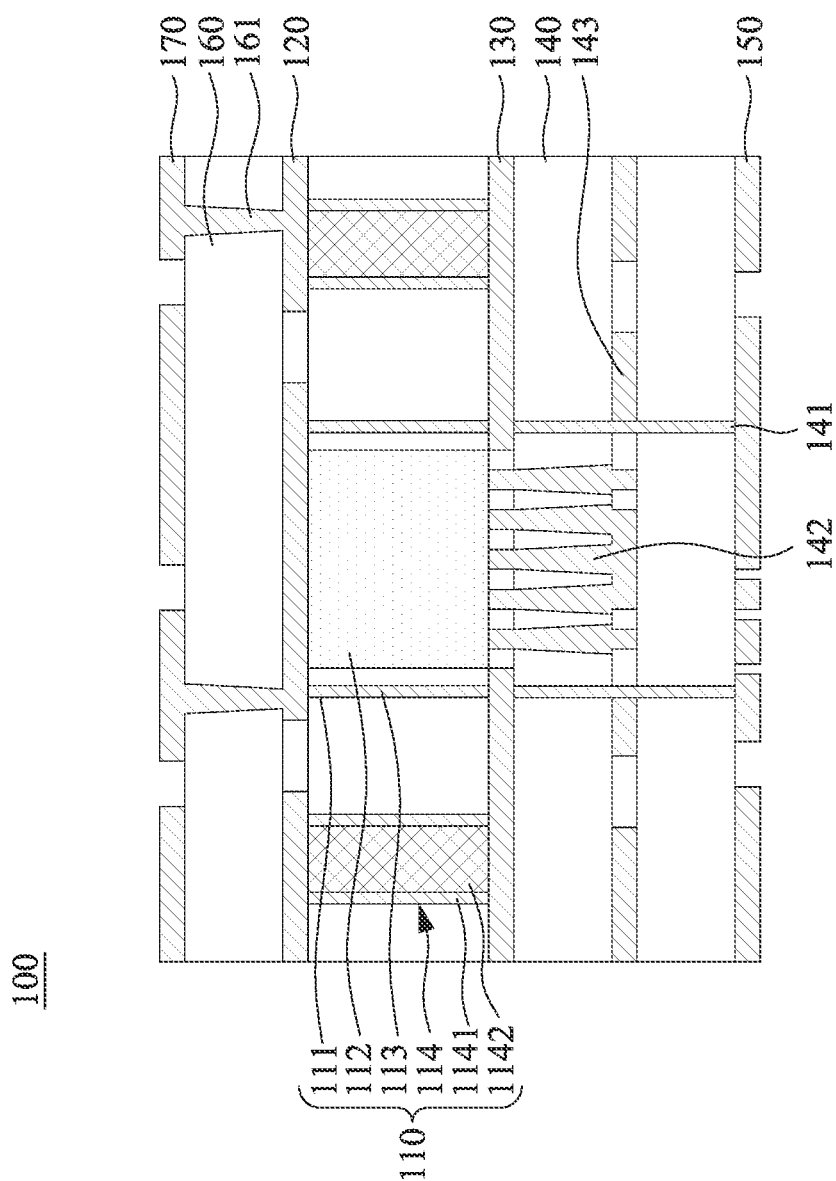

Then referring to FIG. 2J, the core layer 110 is separated from the substrate 210 by the first release film 230, and a first circuit layer 120 is formed on a surface of the core layer 110 that is not adhered to the first insulating layer 140. Specifically, the first circuit layer 120 is formed by electroplating or metal deposition and then etching. Next, a second insulating layer 160 is formed on the first circuit layer 120, and a plurality of conductive columns 161 are formed in the second insulating layer 160, and a wiring layer 170 is then formed on the second insulating layer 160. Specifically, the first circuit layer 120 is disposed between the second insulating layer 160 and the core layer 110, and the second insulating layer 160 is disposed between the wiring layer 170 and the first circuit layer 120.

So far, the circuit board assembly 100 as shown in FIG. 1A is formed, which has the effect of shielding the electromagnetic waves leaking from the electronic component 112 in all directions.

Next, the manufacturing method and the process flow of the circuit board assembly 300 of the embodiment shown in FIG. 3A will be described in detail below.

First of all, it should be noted that in order to provide the graphene layer 315 on the core layer 310 in the circuit board assembly 300, the electronic component 112 is not disposed during the step of filling the conductive materials 1142 shown in FIG. 2E, but the second dielectric pattern layer 240" is firstly stacked on the first dielectric pattern layer 220", and the conductive materials 1142 are bonded.

Figure 4A:
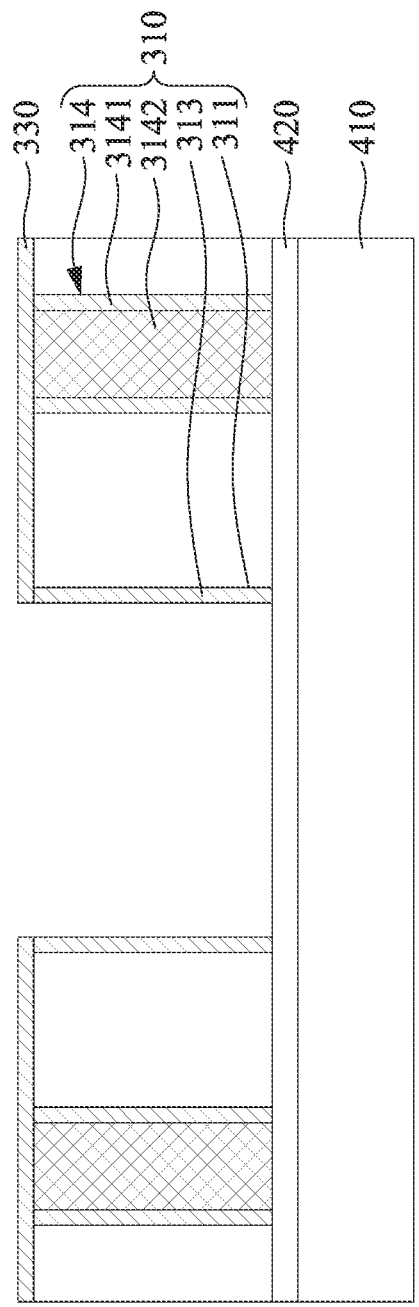
FIGS. 4A to 4D are schematic cross-sectional views illustrating a method of manufacturing a circuit board assembly at various process stages according to other embodiments of the present disclosure.

Referring to FIG. 4A, a first shielding ring wall 313 is formed on an inner sidewall of an accommodating space 311, and a second circuit layer 330 is formed on a core layer 310. The method of forming the first shielding ring wall 313 and the second circuit layer 330 includes, but is not limited to, a deposition process, an electroplating process, a coating process, or a combination thereof.

Figure 4B:
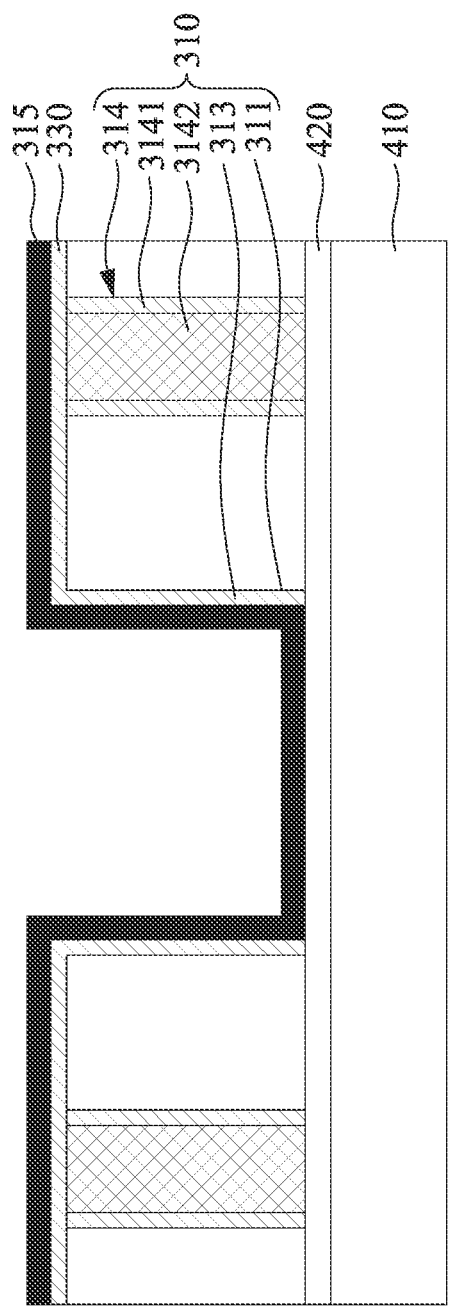

Next, as shown in FIG. 4B, the graphene layer 315 is formed on a substrate 410, an inner side of the first shielding ring wall 313, and the second circuit layer 330. The graphene layer 315 is continuous and integrally formed. In one embodiment, the graphene layer 315 is embedded in the core layer 310 and on the second circuit layer 330.

Figure 4C:
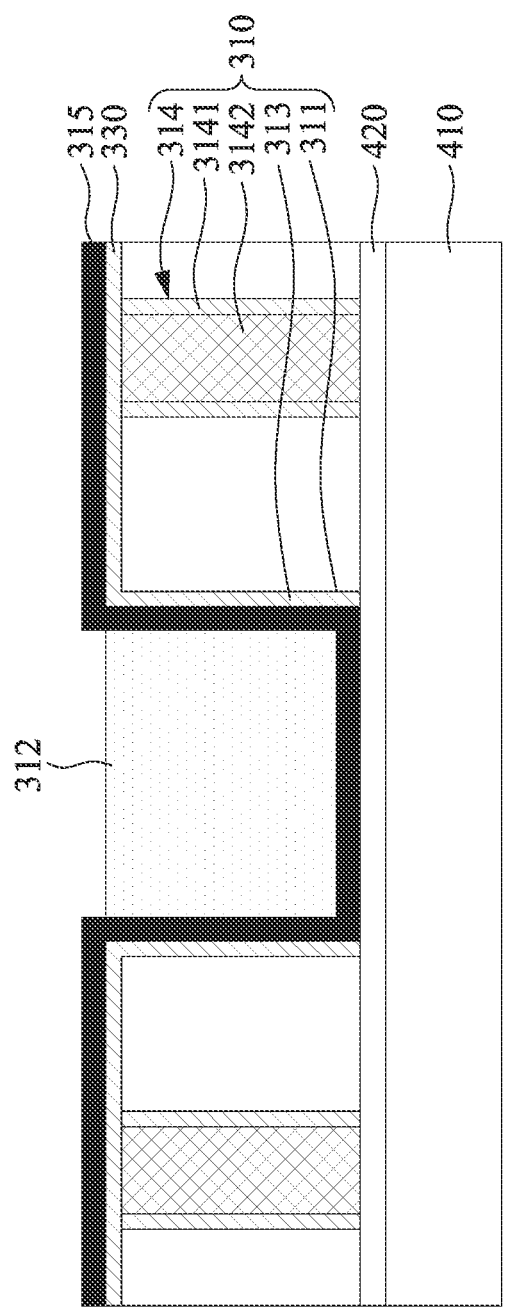

Referring again to FIG. 4C, the electronic component 312 is disposed in the graphene layer 315. Specifically, the graphene layer 315 covers the electronic component 312 and electrically separates the electronic component 312 and the first shielding ring wall 313.

Figure 4D:
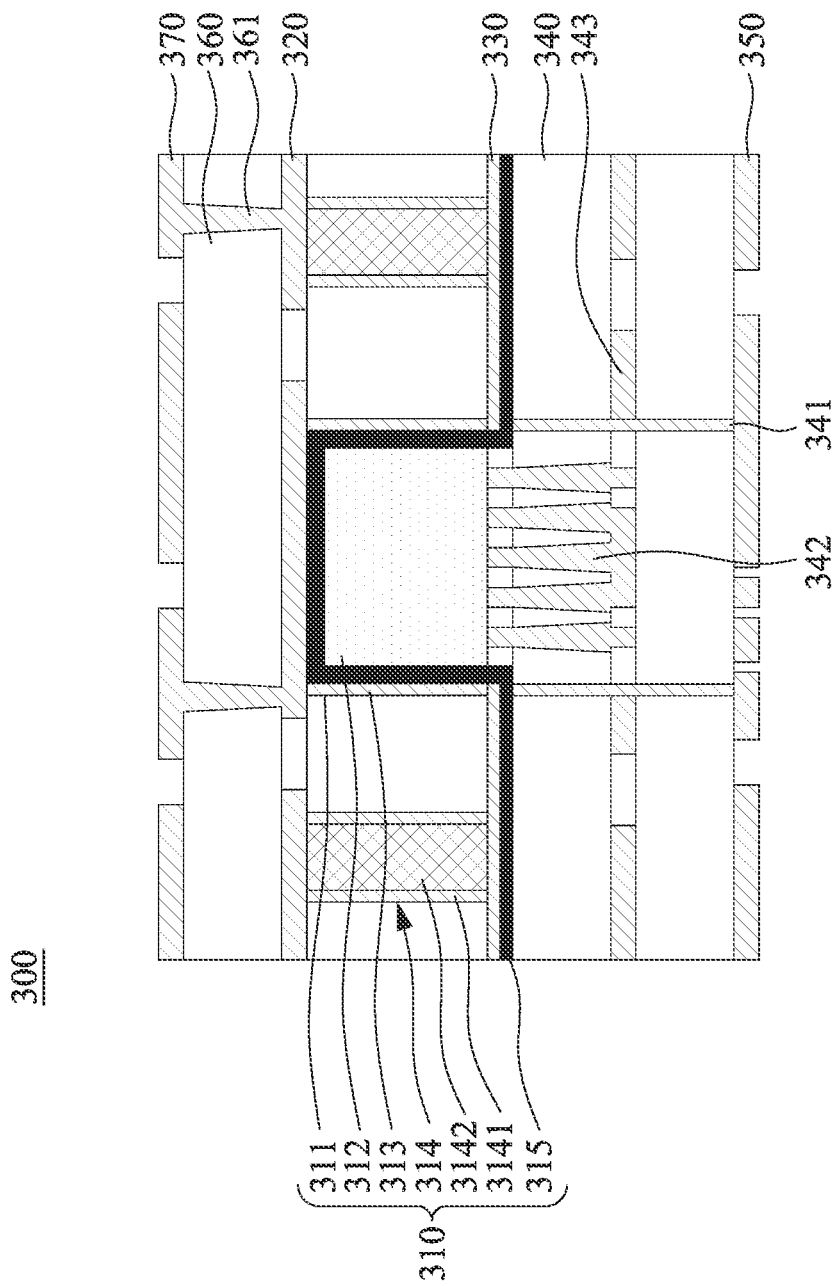

Next, as shown in FIG. 4D, after the graphene layer 315 is formed and the electronic component 312 is disposed, subsequent steps are the same as those in FIG. 2G to FIG. 2J, and a first insulating layer 340, a shielding column 341, a conductive column 342, a build-up circuit layer 343, a shielding layer 350, a first circuit layer 320, a second insulating layer 360, a conductive column 361 and a wiring layer 370 are formed. As such, the circuit board assembly 300 as shown in FIG. 3A is formed, which has the effect of shielding the electromagnetic waves leaking from the electronic component 312 in all directions, and has the effect of enhancing the heat dissipation efficiency.

Hereinafter, the manufacturing method and the process flow of the circuit board assembly 500 of the embodiment shown in FIG. 5A will be described in detail.

Figure 6A:
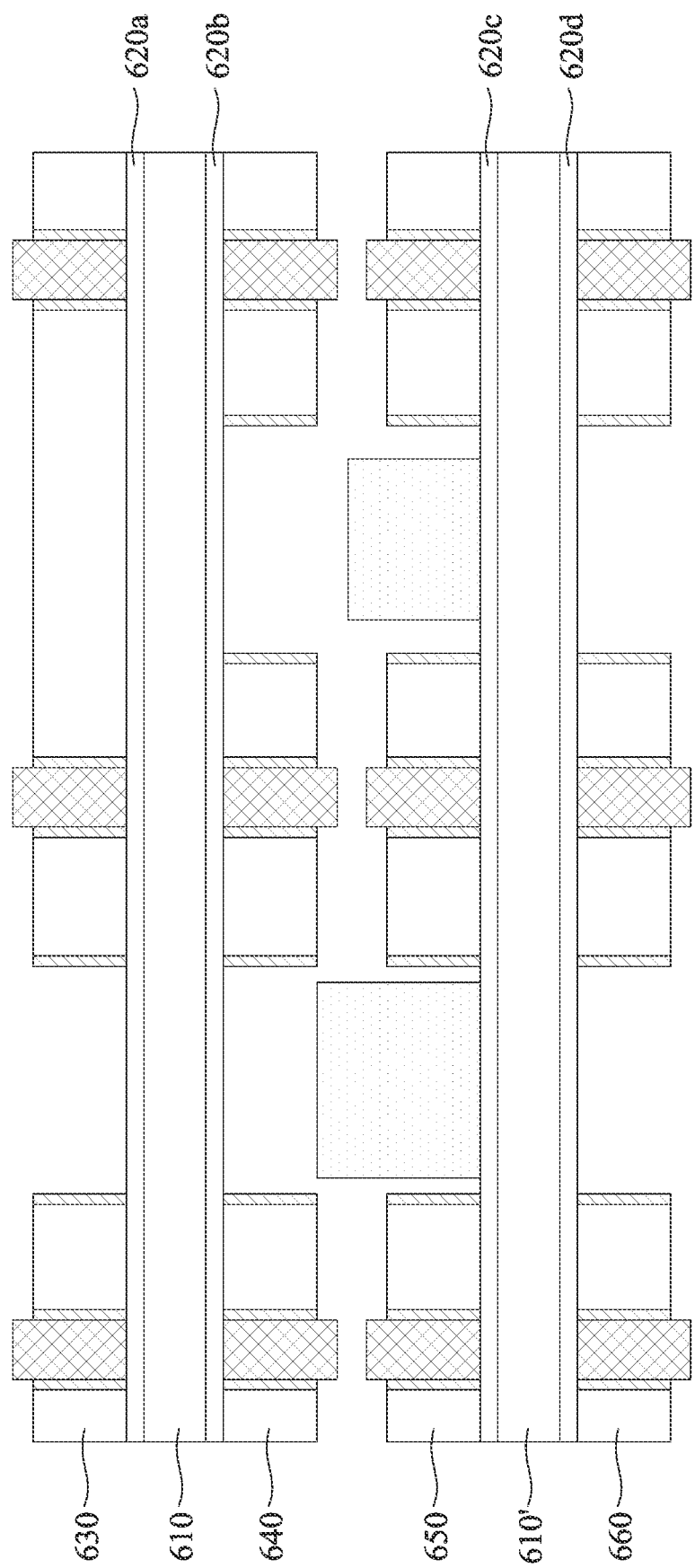
FIGS. 6A to 6C are schematic cross-sectional views illustrating a method of manufacturing a circuit board assembly at various process stages according to still other embodiments of the present disclosure.
Figure 6B:
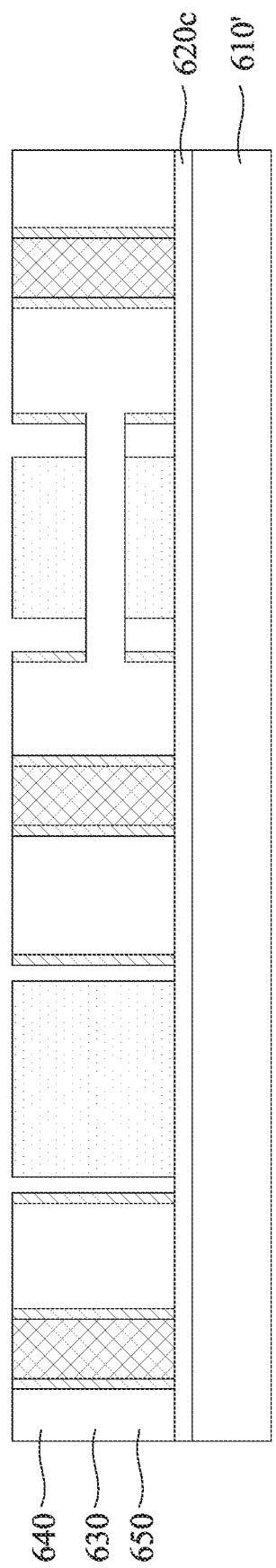
Figure 6C:
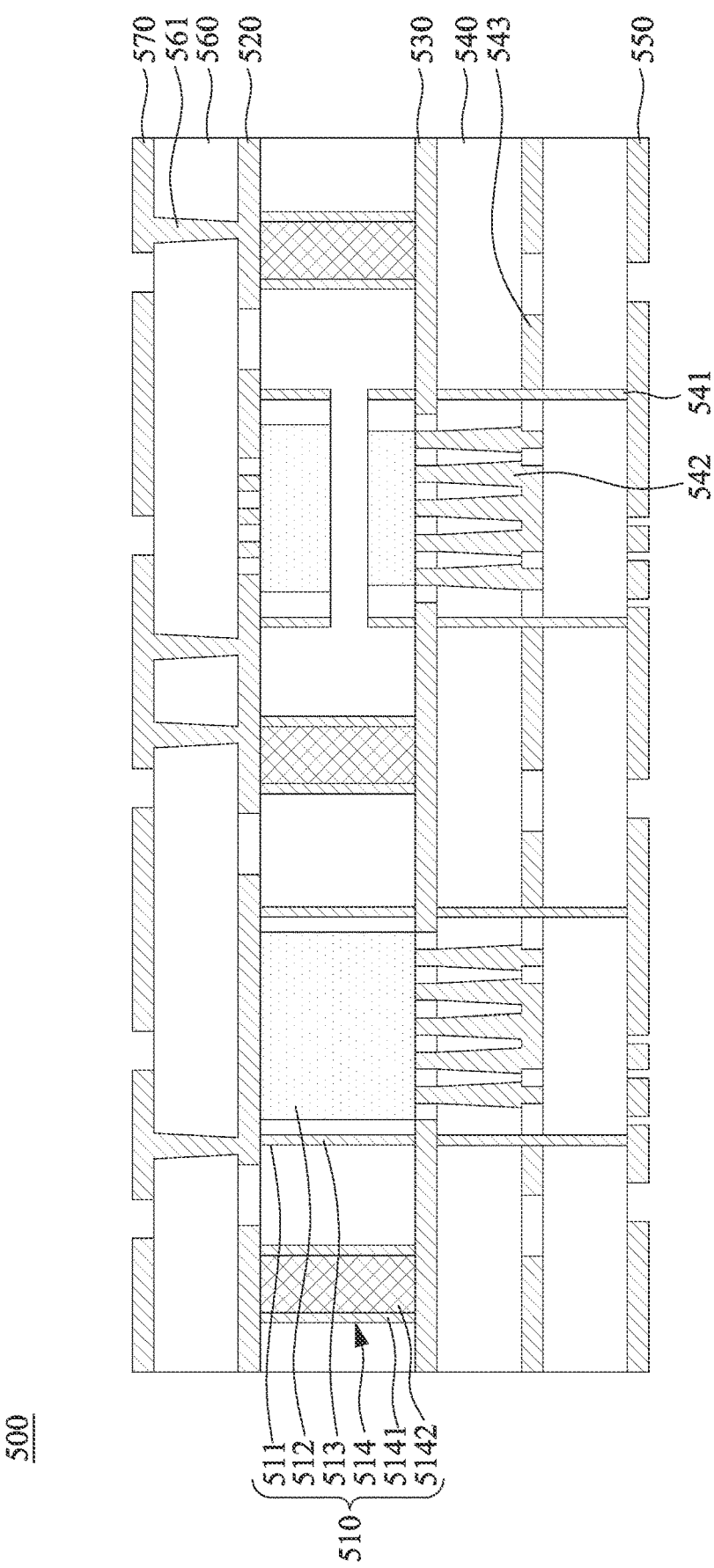

Please refer to FIGS. 6A to 6C. FIGS. 6A to 6C are schematic cross-sectional views illustrating a method of manufacturing a circuit board assembly at various process stages according to still other embodiments of the present disclosure. The difference between this embodiment and the previously described embodiment is that a plurality of electronic components 512 are provided in this embodiment.

First, as shown in FIG. 6A, a first dielectric pattern layer 630 and a first release film 620a are formed on one side of a first substrate 610, and a second dielectric pattern layer 640 and a second release film 620b are formed on another side thereof, in which the first release film 620a is disposed between the first dielectric pattern layer 630 and the first substrate 610, and the second release film 620b is disposed between the second dielectric pattern layer 640 and the first substrate 610. A third dielectric pattern layer 650 and a third release film 620c are formed on one side of a second substrate 610', and a fourth dielectric pattern layer 660 and a fourth release film 620d are formed on another side thereof, in which the third release film 620c is disposed between the third dielectric pattern layer 650 and the second substrate 610', and the fourth release film 620d is disposed between the fourth dielectric pattern layer 660 and the second substrate 610'. In addition, the electronic components 512 are disposed in a plurality of recesses of the third dielectric pattern layer 650.

Next, as shown in FIG. 6B, the first dielectric pattern layer 630 and the second dielectric pattern layer 640 are peeled off sequentially by the first release film 620a and the second release film 620b, and the first dielectric pattern layer 630 and the second dielectric pattern layer 640 are sequentially stacked on the third dielectric pattern layer 650 and the electronic elements 512. The first dielectric pattern layer 630, the second dielectric pattern layer 640, and the third dielectric pattern layer 650 are adhered to each other. In addition, another electronic element 512 is further disposed on the stacked first dielectric pattern layer 630 and in the second dielectric pattern layer 640. When upper surfaces of the electronic components 512 cannot be coplanar with an upper surface of the second dielectric pattern layer 640, the fourth dielectric pattern layer 660 can be further adjusted to make an upper surface of the core layer 510 be flat.

As shown in FIG. 6C, subsequent steps are the same as those in FIGS. 2G to 2J. Accordingly, the first insulating layer 540, the shielding column 541, the conductive column 542, the build-up circuit layer 543, the shielding layer 550, the first circuit layer 520, the second insulating layer 560, the conductive column 561 and the wiring layer 570 are formed. As such, the circuit board assembly 500 as shown in FIG. 5A is formed, which has the effect of shielding the electromagnetic waves leaking from the electronic components 512 in all directions.

In summary, the circuit board assembly of the present disclosure is provided with the first shielding ring wall around each of the electronic components, which preliminarily shields the electromagnetic waves. Next, the second shielding ring wall is used to shield the electromagnetic waves leaking from the electronic components due to the difference in size. The first shielding column and/or the second shielding column are further used to shield the electromagnetic field generated by the conductive columns. Next, the shielding layer is disposed to enhance the overall shielding effect. In addition, the present disclosure can also provide the graphene layer to increase the heat dissipation effect of the circuit board assembly. Accordingly, the present disclosure can effectively avoid the electromagnetic interference between the electronic components.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. The scope of protection of the present disclosure shall be subject to the scope of appended claims.

What is claimed is:

1. A method of manufacturing a circuit board assembly, comprising:

providing a substrate;

forming a first dielectric layer and a first release film on the substrate and while forming a second dielectric layer and a second release film on opposite side of the substrate, opposite to the first dielectric layer, wherein the first release film is disposed between the first dielectric layer and the substrate and the second release film is disposed between the second dielectric layer and the substrate;

patterning the first dielectric layer to form a first dielectric pattern layer, wherein the first dielectric pattern layer has at least one first recess and at least one first groove;

patterning the second dielectric layer to form a second dielectric pattern layer, wherein the second dielectric pattern layer has at least one second recess and at least one second groove;

forming a first metal layer on the first dielectric pattern layer, wherein the first metal layer covers an upper surface of the first dielectric pattern layer, a sidewall of the at least one first recess and a sidewall of the at least one first groove;

forming a second metal layer on the second dielectric pattern layer, wherein the second metal layer covers an upper surface of the second dielectric pattern layer, a sidewall of the second recess and a sidewall of the second groove;

disposing at least one electronic component in the at least one first recess, wherein the at least one electronic component is disposed on the substrate;

bonding the second dielectric pattern layer onto the first dielectric pattern layer and the at least one electronic component after disposing the at least one electronic component in the at least one first recess to form a core layer including the first dielectric pattern layer and the second dielectric pattern layer;

forming at least one circuit layer on the core layer;

forming at least one insulating layer on the at least one circuit layer; and forming a plurality of shielding columns in the at least one insulating layer.

2. The method of claim 1, further comprising:

filling a plurality of conductive materials in the at least one first groove and the at least one second groove during disposing the at least one electronic component in the at least one first recess, wherein the conductive materials protrude from a surface of the first dielectric pattern layer and a surface of the second dielectric pattern layer.

3. The method of claim 1, further comprising:

after respectively forming the first metal layer and the second metal layer on the first dielectric pattern layer and the second dielectric pattern layer, and before disposing the at least one electronic component in the at least one first recess, thinning the first metal layer, the second metal layer, the first dielectric pattern layer, and the second dielectric pattern layer to expose an upper surface of the first dielectric pattern layer and an upper surface of the second dielectric pattern layer.

4. The method of claim 1, wherein patterning the first dielectric layer and the second dielectric layer comprises an exposure process and a development process.

5. The method of claim 1, wherein disposing the second dielectric pattern layer on the first dielectric pattern layer and the at least one electronic component, the second dielectric pattern layer and the first dielectric pattern layer are adhered to each other.

6. The method of claim 1, wherein in the step of disposing the second dielectric pattern layer on the first dielectric pattern layer and the at least one electronic component, the substrate, the first dielectric pattern layer, the second dielectric pattern layer, the at least one electronic component and the conductive materials are in a working environment with a temperature in a range from 25° C. to 180° C.

7. The method of claim 1, further comprising:

removing the substrate after forming a plurality of conductive columns in the at least one insulating layer;

forming at least one build-up circuit layer on the core layer; and forming at least one build-up insulating layer on the at least one build-up circuit layer.

8. The method of claim 7, wherein portions of the conductive columns are disposed in the at least one insulating layer along the first metal layer and the second metal layer adjacent to the at least one electronic component.

\* \* \* \* \*